United States Patent
Wynne et al.

(10) Patent No.: US 6,924,759 B2
(45) Date of Patent: Aug. 2, 2005

(54) MULTI-CHANNEL INTEGRATED CIRCUIT COMPRISING A PLURALITY OF DACS, AND A METHOD FOR MONITORING THE OUTPUT OF THE DACS

(75) Inventors: John Wynne, Limerick (IR); Donal P. Geraghty, Limerick (IR); Albert C. O'Grady, Mungret (IR)

(73) Assignee: Analog Devices, Inc., Norwood, MA (US)

( * ) Notice: Subject to any disclaimer, the term of this patent is extended or adjusted under 35 U.S.C. 154(b) by 60 days.

(21) Appl. No.: 10/731,334

(22) Filed: Dec. 9, 2003

(65) Prior Publication Data

US 2004/0113177 A1 Jun. 17, 2004

Related U.S. Application Data

(60) Provisional application No. 60/431,909, filed on Dec. 9, 2002.

(51) Int. Cl.[7] ............................................... H03M 1/66
(52) U.S. Cl. ...................... 341/144; 341/143; 341/136
(58) Field of Search ................................ 341/144, 143, 341/136

(56) References Cited

U.S. PATENT DOCUMENTS

| | | | | |
|---|---|---|---|---|
| 5,099,239 A | * | 3/1992 | Bruce et al. ................. | 341/128 |
| 5,801,655 A | * | 9/1998 | Imamura ..................... | 341/144 |
| 6,052,074 A | * | 4/2000 | Iida ............................ | 341/144 |
| 6,531,975 B1 | * | 3/2003 | Trotter et al. ............... | 341/144 |
| 6,583,741 B1 | * | 6/2003 | Knudsen ..................... | 341/143 |
| 6,809,673 B2 | * | 10/2004 | Scanlan et al. ............. | 341/144 |

FOREIGN PATENT DOCUMENTS

WO     WO 02/093751     11/2002

OTHER PUBLICATIONS

International Search Report from corresponding International Application No. PCT/IE03/00164, filed Dec. 24, 2003.

"Application Note—8–bit non–volatile digital–to–analogue converters (DACs)", Elekto Electronics, Sep. 21, 1995, pp. 22–24.

* cited by examiner

Primary Examiner—Don Le
Assistant Examiner—Lam T. Mai
(74) Attorney, Agent, or Firm—Wolf, Greenfield & Sacks, P.C.

(57) ABSTRACT

A multi-channel circuit (1) comprising a plurality of on-chip channels (CH1 to CH4), each of which comprises a DAC (3) for converting digital data into analogue output signals independently of each other under the control of an interface and control logic circuit (11). The analogue output signals from the DACs (3) are outputted on output terminals (7) of the respective channels (CH1 to CH4). The digital input data and control and address signals for controlling the conversion of the digital data in the DACs (3) are inputted to the interface and control logic circuit (11) through an I/O port (10). DAC registers (9) are provided in the respective channels (CH1 to CH4) for storing the digital words to be converted in the corresponding DACs (3). Analogue input terminals (20) are provided for receiving analogue input signals (20), for example, analogue signals from external systems which may be controlled by the output signals from the DACs (3). A multiplexer (15) is operable under the control of the interface and control logic circuit (11) for selectively and sequentially applying the analogue output signals from the DACs (3) and the analogue input signals from the analogue input terminals (20) to a monitoring output terminal (16) for facilitating independent monitoring of the analogue output signals from the DACs (3), and the analogue inputs on the analogue input terminals (20).

21 Claims, 2 Drawing Sheets

MULTI-CHANNEL INTEGRATED CIRCUIT COMPRISING A PLURALITY OF DACS, AND A METHOD FOR MONITORING THE OUTPUT OF THE DACS

This application claims the benifit of Provisional Application Ser. No. 60/431,909, filed Dec. 9, 2002.

FIELD OF THE INVENTION

The present invention relates to a multi-channel integrated circuit, and in particular, to a multi-channel integrated circuit comprising a plurality of DACs, one DAC being provided in each channel. The invention also relates to a method for monitoring the output of the DACs of the multi-channel integrated circuit.

Background to the Invention

Multi-channel integrated circuits which comprise a plurality of DACs, one DAC being located in each channel, are commonly used for converting digital data from one or more sources to analogue output signals. In general, the analogue output signals from the respective DACs are provided on corresponding output terminals, and the respective analogue output signals can then be read from the analogue output terminals, or applied to other analogue circuitry for further processing. Commonly, it is desirable to monitor some or all of the analogue output signals from the respective DACs, and in many cases, it is desirable, and indeed, necessary to compare the analogue output signals from some or all of the respective DACs with reference signals for, for example, determining if the analogue output signals being outputted by the respective DACs are of a level, for example, a voltage level or a current level corresponding to the value or values of digital words from which the analogue output signals are generated. This, in general, requires coupling a suitable monitoring circuit to each of the analogue output terminals for sequentially reading out the analogue output signals on the output terminals. Where the analogue output signals are to be compared with reference signals, signals from the monitoring circuit must then be read by suitable comparing circuitry which must also read the corresponding reference signals for facilitating a comparison of the analogue output signals with the reference signal or signals. Such a method for monitoring the analogue output signals of the respective DACs is cumbersome, inconvenient, and indeed, does not lend itself to accurate comparisons being made, since voltage drops may occur where additional couplings have to be made to the respective output terminals. Additionally, line voltage drops may also occur between the output terminals and the monitoring circuitry. This is undesirable.

There is therefore a need for a multi-channel integrated circuit comprising a plurality of DACs which overcomes this problem, and there is also a need for a method for monitoring the output of DACs of a multi-channel integrated circuit, which similarly overcomes these problems.

The present invention is directed towards providing such a multi-channel integrated circuit, and the invention is also directed towards a method for monitoring analogue output signals from a plurality of DACs of a multi-channel integrated circuit which overcomes these problems.

SUMMARY OF THE INVENTION

According to the invention there is provided a multi-channel integrated circuit comprising:
 a plurality of on-chip channels,
 a digital-to-analogue converter (DAC) located in each channel, each DAC having an analogue output,
 an on-chip digital input port for receiving digital data,
 an on-chip interface and control logic circuit for receiving digital data from the digital input port and for selectively applying the digital data to the DACs for conversion thereof to analogue output signals,
 an on-chip monitoring output terminal, and
 an on-chip switch network coupled to the on-chip monitoring output terminal and to the analogue outputs of at least some of the DACs, the switch network being operable under the control of the interface and control logic circuit for selectively switching the analogue output signals from the at least some of the DACs to the monitoring output terminal for facilitating external monitoring thereof.

In one embodiment of the invention the analogue output of each DAC is coupled to the switch network. Preferably, each on-chip channel of the plurality of on-chip channels terminates in a corresponding on-chip analogue output terminal for outputting the analogue output signal from the corresponding DAC.

In another embodiment of the invention at least one on-chip analogue input terminal is provided for receiving a corresponding analogue input signal, each analogue input terminal being coupled to the switch network, and the switch network is operable under the control of the interface and control logic circuit for selectively switching each analogue input signal to the monitoring output terminal. Preferably, a plurality of analogue input terminals are provided, each of which are coupled to the switch network for receiving respective analogue input signals.

Advantageously, the switch network is operated under the control of the interface and control logic circuit for sequentially switching the analogue output signals from the DACs and the analogue input signals from the analogue input terminals to the monitoring output terminal.

In one embodiment of the invention the interface and control logic circuit is responsive to an externally generated control signal applied through the input port for operating the switch network.

In another embodiment of the invention the switch network is provided by a multiplexer.

In a further embodiment of the invention a DAC register is located in each on-chip channel for sequentially receiving digital data words from the input port under the control of the interface control logic circuit for loading into the corresponding DAC for conversion thereof.

In one embodiment of the invention correction code registers are provided corresponding to at least some of the respective DACs for storing respective correction codes for correcting for offset errors in the corresponding DACs, and corresponding adding means are provided for adding the correction codes to digital data words to be converted by the corresponding DACs. Preferably, each correction code register is programmable.

Additionally the invention provides a method for monitoring respective analogue output signals from at least some of a plurality of on-chip DACs located in respective on-chip channels of a multi-channel integrated circuit, the method comprising the steps of:
 providing an on-chip monitoring output terminal in the integrated circuit for sequential monitoring of the analogue output signals from the at least some of the DACs,
 providing an on-chip switch network for selectively coupling analogue outputs of the at least some of the DACs to the monitoring output terminal for selectively applying the analogue output signals from the DACs to the monitoring output terminal,
 providing an on-chip interface and control logic circuit for controlling the switch network for selectively switching the analogue output signals to the monitoring output terminal, and reading the analogue output signals from the monitoring output terminal.

In one embodiment of the invention an on-chip input port is provided for inputting an externally generated control signal to the interface and control logic circuit for controlling the operation of the switch network.

In another embodiment of the invention the method further comprises providing at least one on-chip analogue input terminal for receiving a corresponding analogue input signal, coupling each analogue input terminal to the switch network, and operating the switch network under the control of the interface and control logic circuit for selectively switching the analogue input signal on each analogue input terminal to the monitoring output terminal for monitoring thereof. Preferably, a plurality of analogue input terminals are provided for receiving respective analogue input signals.

In one embodiment of the invention the analogue output signals from the respective DACs and the analogue input signals from the respective analogue input terminals are sequentially switched by the switch network to the monitoring output terminal.

In another embodiment of the invention the method further comprises the step of applying analogue input signals to the respective analogue input terminals.

Preferably, a plurality of on-chip analogue output terminals are provided, one on-chip analogue output terminal being provided for each on-chip channel for outputting the analogue output signals of the respective DACs independently of each other.

In one embodiment of the invention the method further comprises the step of selectively applying digital data to the respective DACs through the on-chip digital input port under the control of the interface and control logic circuit for conversion thereof to analogue output signals.

In a further embodiment of the invention the method further comprises providing correction code registers corresponding to at least some of the respective DACs for storing respective correction codes for correcting for offset errors in the corresponding DACs, and providing corresponding adding means for adding the correction codes to digital data words to be converted by the corresponding DACs. Preferably, each correction code register is programmable.

ADVANTAGES OF THE INVENTION

The advantages of the multi-channel integrated circuit according to the invention are many. A particularly important advantage of the multi-channel circuit is that the analogue output signals from the respective DACs can be individually monitored independently of the signals on the analogue output terminals of the respective on-chip channels. This permits selective monitoring of the analogue output signals of the DACs without affecting conversion of digital data to analogue signals by the multi-channel circuit. A further advantage of the invention is achieved when on-chip analogue input terminals are provided for receiving respective analogue input signals. This permits analogue input signals which are applied to the respective analogue input terminals to be selectively switched to the monitoring output terminal for individual monitoring thereof. The provision of the analogue input terminals coupled to the switch network is particularly advantageous, in that analogue response signals from external systems, which may, for example, be controlled by output signals from the DACs, may be applied to the analogue input terminals. The analogue response signals on the analogue input terminals could then be selectively switched to the monitoring output terminal for monitoring by an appropriate monitoring circuit, which typically, would comprise a microprocessor for analysing the analogue response signals. The microprocessor of the monitoring circuit could then write appropriate digital codes to the DACs of the multi-channel integrated circuit for altering the analogue output signals from one or more of the DACs, should this be necessary based on the analogue response signals applied to the analogue input terminals.

The invention and its many advantages will be readily apparent from the following description of some preferred embodiments thereof, which are given solely by way of example only, with reference to the accompanying drawing.

DETAILED DESCRIPTION OF PREFERRED EMBODIMENTS OF THE INVENTION

Figure 1:
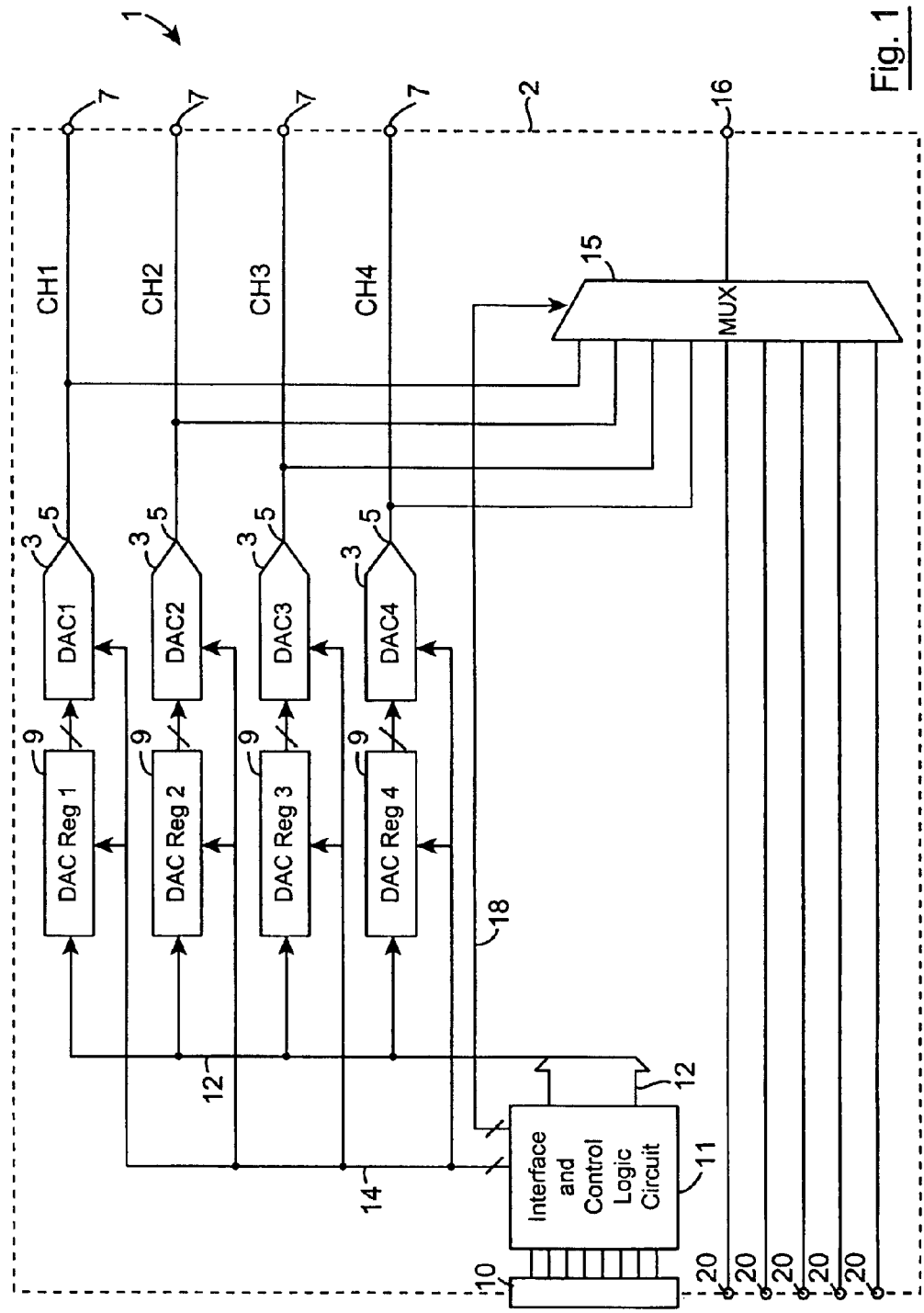
FIG. 1 is a block representation of a multi-channel integrated circuit according to the invention.

Referring to the drawing, and initially to FIG. 1, there is illustrated a multi-channel integrated circuit according to the invention, indicated generally by the reference numeral 1. The multi-channel integrated circuit 1 is implemented as an integrated circuit on a single chip 2, and may be a stand alone integrated circuit, or may form part of a larger integrated circuit on the chip 2, with which it interfaces. The multi-channel circuit 1 comprises a plurality of on-chip channels CH1 to CHN. However, in this embodiment of the invention four channels CH1 to CH4 are illustrated, although, needless to say, it will be readily apparent to those skilled in the art that any number of channels may be provided, and in a typical implementation of the multi-channel circuit 1, it is envisaged that up to forty channels CH1 to CH40 may be provided. DACs 3 are provided in the respective channels CH1 to CH4 for converting digital data to analogue output signals independently of each other. The analogue output signals are provided on analogue outputs 5 of the respective DACs 3, and are in turn relayed to on-chip analogue output terminals 7, in which the corresponding channels CH1 to CH4 terminate. For convenience the DACs 3 are identified as DAC1 to DAC4, which correspond to the channels CH1 to CH4. The analogue output signals from the respective DACs 3 on the corresponding analogue output terminals 7 may be read therefrom, or applied to other suitable circuitry for further processing, and such further circuitry may be integrated circuitry on the chip 2, or may be circuitry external to the chip 2. A DAC register 9 is provided in each channel CH1 to CH4 for sequentially receiving digital words for conversion by the corresponding DAC 3. The DAC registers 9 of the respective channels CH1 to CH4 are identified as DAC Reg 1 to DAC Reg 4, corresponding to the channels CH1 to CH4.

An on-chip I/O port 10 is provided for receiving digital data to be converted in the DACs 3, and for receiving addresses and control signals for controlling the operation of the multi-channel integrated circuit 1. The I/O port 10 may be a serial or parallel I/O port 10. An on-chip interface and control logic circuit 11 receives the digital data, addresses and control signals from the I/O port 10 and selectively applies digital data words of the digital data to be converted to analogue signals to the DAC registers 9 of corresponding DACs 3. The DACs 3 are independently operable under the control of the interface and control logic circuit 11 for converting the digital words to analogue output signals.

Digital data words to be converted in the DACs 3 are outputted from the interface and control logic circuit 11 on a parallel data bus 12 to the DAC registers 9. The digital words are selectively written to the corresponding DAC registers 9 under the control of control signals on a first control bus 14 from the interface and control logic circuit 11. Control signals on the first control bus 14 from the interface and control logic circuit 11 control the loading of the digital data words from the DAC registers 9 to the corresponding DACs 3. The DACs 3 and the DAC registers 9 in the respective channels CH1 to CH4 are operable independently of each other under the control of the interface and control logic circuit 11 in response to the control signals on the first control bus 14 for converting respective digital data words to analogue output signals.

A switch network comprising an on-chip multiplexer 15 is coupled to the respective analogue outputs 5 of the DACs 3 for selectively and sequentially applying the analogue output signals from the DACs 3 to an on-chip monitoring output terminal 16 for facilitating monitoring of the analogue output signals from the DACs 3 independently of the analogue output terminals 7. The multiplexer 15 is operable under the control of the interface and control logic circuit 11 for selectively applying the analogue output signals from the DACs 3 to the monitoring output terminal 16 in response to switching signals applied to the multiplexer 15 on a second control bus 18. The interface and control logic circuit 11 outputs appropriate switching signals on the second control bus 18 to the multiplexer 15 in response to externally generated signals entered through the I/O port 10 for sequentially switching the analogue output signals from selected DACs 3 to the monitoring output terminal 16.

A plurality of on-chip analogue input terminals, in this embodiment of the invention five analogue input terminals 20 are provided for receiving respective analogue input signals, which may, for example, be analogue signals from external systems which are being controlled by the output signals from the DACs 3. The analogue input terminals 20 are coupled to the multiplexer 15, which also under the control of switching signals on the second control bus 18 from the interface and control logic circuit 11, selectively and sequentially switches the analogue input signals on the analogue input terminals 20 to the monitoring output terminal 16. The sequence in which the analogue output signals from the DACs 3, and the analogue input signals from the analogue input terminals 20 are switched to the monitoring output terminal 16, and the duration for which the respective analogue output and input signals are switched to the monitoring output terminal 16 may be programmed into the interface and control logic circuit 11 through the I/O port 10. Alternatively, the multiplexer 15 may be operated directly by an externally generated switching signal which would be inputted through the I/O port 10 and applied directly to the multiplexer 15 through the interface and control logic circuit 11 on the second control bus 18.

In use, digital data and address and control signals are applied to the interface and control logic circuit 11 through the I/O port 10. Under the control of the interface and control logic circuit 11 in response to the control and address signals received through the I/O port 10, the digital data is converted to analogue output signals in the DACs 3, and in turn outputted through the corresponding output terminals 7. Where it is desired to monitor the analogue output signals from the DACs 3, appropriate control signals are inputted to the interface and control logic circuit 11 through the I/O port 10, which operates the multiplexer 15 in response to the appropriate control signals for selectively switching the analogue output signals from the DACs 3 to the monitoring output terminal 16. Additionally, should it be desired to switch analogue input signals on the analogue input terminals 20 to the monitoring output terminal 16, the multiplexer 15 is operated under the control of the interface and control logic circuit 11 in response to appropriate control signals inputted through the I/O port 10 for selectively switching the analogue input signals on the respective analogue input terminals 20 to the monitoring output terminal 16.

Typically, in use it is envisaged that analogue response signals from an external system or systems which would be controlled by the output signals from the DACs 3 may be applied to the analogue input terminals 20. Such analogue response signals may, for example, be analogue signals from sensors or other such devices for monitoring the performance of the external system or systems. At appropriate times, it may be desired to monitor such analogue response signals by a suitable monitoring circuit, which typically would comprise a microprocessor. Accordingly, by applying the analogue response signals from the external system or systems to the analogue input terminals 20, the analogue response signals can be sequentially switched from the analogue input terminals 20 to the monitoring output terminal 16, and from there relayed to the microprocessor of the monitoring circuit. The analogue response signals from the analogue input terminals 20 may then be compared with corresponding reference signals by the microprocessor of the monitoring circuit, and if the analogue response signals do not compare favourably with the corresponding reference signals, the microprocessor may write an appropriate code or codes to one or more of the DACs 3 for altering the analogue output signals of the DAC or DACs 3 for in turn making corrections to the external system or systems controlled by the DAC or DACs 3. As digital codes are written to the DACs 3, the analogue output signals from the DACs 3 may be sequentially switched to the monitoring output terminal 16 by the multiplexer 15 for monitoring by the monitoring circuit, and if the analogue output signal or signals from the DACs 3 are not of the desired value, further appropriate code or codes could be written to the DAC or DACs 3 by the microprocessor of the monitoring circuit.

While the analogue output signals of the DACs 3 are being selectively monitored on the monitoring output terminal 16, the analogue output signals from the respective DACs 3 are simultaneously and independently available on the corresponding output terminals 7 of the channels CH1 to CH4.

Figure 2:
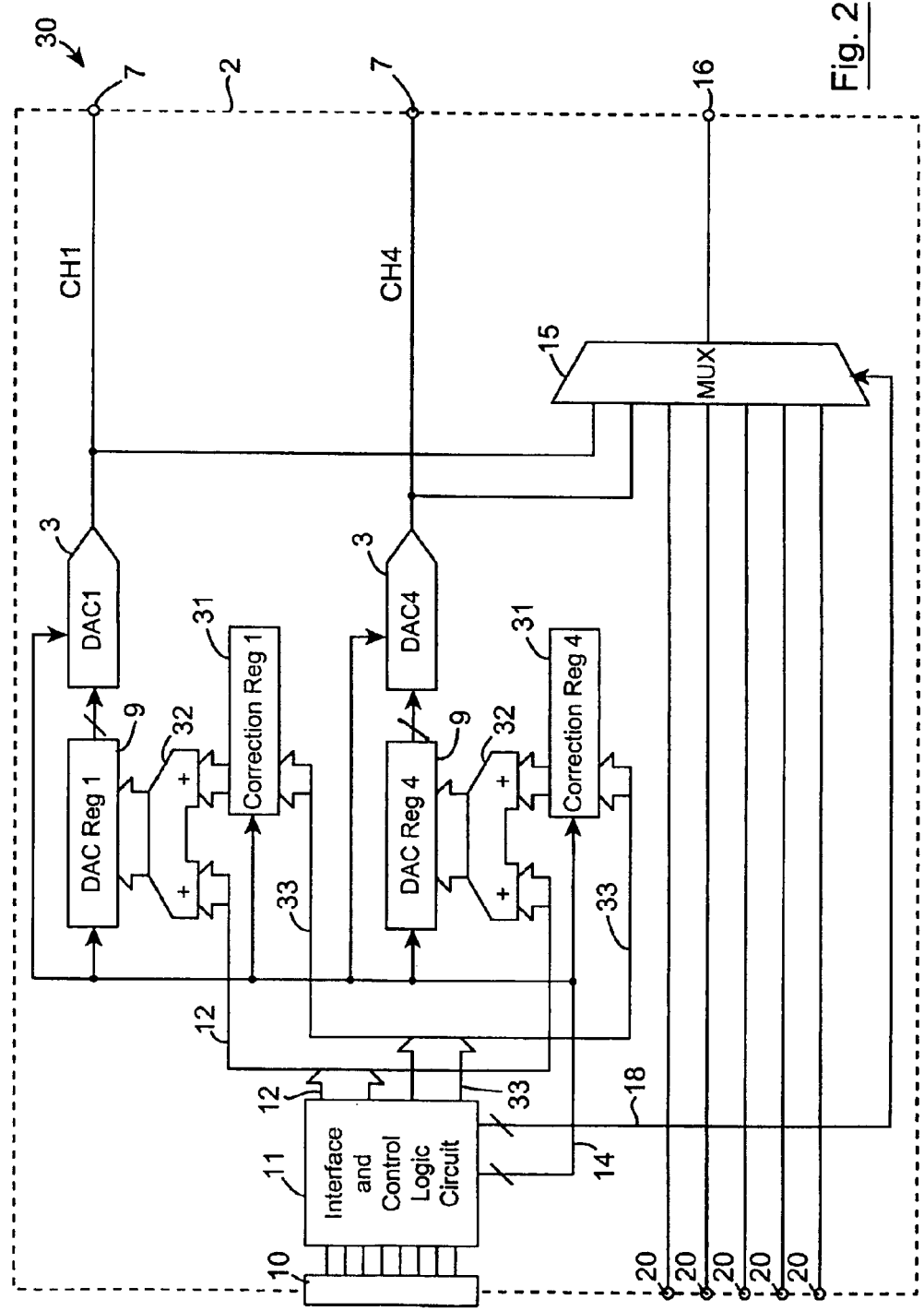
FIG. 2 is a block representation of a multi-channel integrated circuit according to another embodiment of the invention.

Referring now to FIG. 2, there is illustrated a multi-channel integrated circuit according to another embodiment of the invention, indicated generally by the reference numeral 30. The circuit 30 is substantially similar to the circuit 1, and similar components are identified by the same reference numerals. The circuit 30 also comprises four on-chip channels CH1 to CH4, although only channels CH1 and CH4 are illustrated, channels CH2 and CH3 are similar to channels CH1 and CH4. The main difference between the circuit 30 and the circuit 1 is that each on-chip channel CH1 to CH4 is provided with a programmable correction code storing register 31 for storing a correction code for correcting for a voltage offset in the DAC 3 of the corresponding channel CH1 to CH4, and/or a voltage offset in the channel CH1 to CH4, for in turn calibrating the DACs 3, and/or the channel CH1 to CH4. A summing means, namely, an adder 32 corresponding to each DAC 3 sums the correction code in the corresponding correction code register 31 sequentially with corresponding digital data words as they are being written to the corresponding DAC register 9 for conversion in the corresponding DAC 3.

The appropriate correction codes are written to the correction code registers 31 by the interface and control logic circuit 11 on a parallel data bus 33 during calibration of the multi-channel circuit 30. Control signals on the first control bus 14 control the writing of the correction codes to the correction code registers 31. Calibration of the multi-channel circuit 30 is typically carried out under the control of a microprocessor, which inputs control digital words through the I/O port 10 to the interface and control circuit 11 for conversion in the corresponding DACs 3. The microprocessor may also apply corresponding reference voltages to the analogue input terminals 20, and would apply appropriate switching signals to the interface and control logic circuit 11 through the I/O port 10 for operating the multiplexer 15 for selectively applying the analogue output signals from the DACs 3 to the monitoring output terminal 16. Additionally, the control signals for operating the interface and control logic circuit 11 may also operate the multiplexer 15 for selectively switching the analogue input terminals 20 to the monitoring output terminal 16. The analogue output signals from the DACs 3 which are sequentially applied to the monitoring output terminal 16 by the multiplexer 15 are read by the microprocessor and compared with corresponding reference analogue input signals applied to the analogue input terminals 20, for determining the analogue voltage offsets of the respective DACs 3. The microprocessor then determines the appropriate correction code for correcting the voltage offset of each DAC 3, and the appropriate correction codes are written to the appropriate correction code registers 31 under the control of the interface and control logic circuit 11.

Once the multi-channel circuit 30 has been calibrated, its operation is similar to that of the multi-channel circuit 1 which has already been described.

It will be appreciated that the sequence through which the analogue output signals from the DACs and the analogue input signals from the analogue input terminals are switched to the monitoring output terminal may be any desired sequence, and it will of course be readily apparent to those skilled in the art that it is not essential that the analogue outputs of all the DACs be coupled to the multiplexer. Only those DACs, the analogue outputs of which are to be monitored, need be switched to the monitoring output terminal.

It will also be appreciated that the durations for which the respective DAC outputs and analogue input terminals are switched to the monitoring output terminal may be the same for each DAC and analogue input terminal, or different, and the respective desired durations may be programmed into the interface and control logic circuit, or may be selected by an external signal from any suitable source, for example, a microprocessor as each DAC output and/or analogue input terminal is switched to the monitoring output terminal.

While the multi-channel circuits have been described as comprising specific numbers of on-chip channels and analogue input terminals, the multi-channel circuits may be provided with any desired number of on-chip channels and analogue input terminals. Further, it will be appreciated that in certain cases, the multi-channel circuit may be provided without analogue input terminals.

While the multi-channel circuit described with reference to FIG. 2 has been described as comprising a correction code register for each DAC, correction code registers need not necessarily be provided for each and every DAC. Furthermore, while the correction code registers have been described as being programmable, while this is preferable, it is not essential.

What is claimed:

1. A multi-channel integrated circuit comprising:
a plurality of on-chip channels,
a digital-to-analogue converter (DAC) located in each channel, each DAC having an analogue output,
an on-chip digital input port for receiving digital data,
an on-chip interface and control logic circuit for receiving digital data from the digital input port and for selectively applying the digital data to the DACs for conversion thereof to analogue output signals,
an on-chip monitoring output terminal, and
an on-chip switch network coupled to the on-chip monitoring output terminal and to the analogue outputs of at least some of the DACs, the switch network being operable under the control of the interface and control logic circuit for selectively switching the analogue output signals from the at least some of the DACs to the monitoring output terminal for facilitating external monitoring thereof.

2. A multi-channel integrated circuit as claimed in claim 1 in which the analogue output of each DAC is coupled to the switch network.

3. A multi-channel integrated circuit as claimed in claim 1 in which each on-chip channel of the plurality of on-chip channels terminates in a corresponding on-chip analogue output terminal for outputting the analogue output signal from the corresponding DAC.

4. A multi-channel integrated circuit as claimed in claim 1 in which at least one on-chip analogue input terminal is provided for receiving a corresponding analogue input signal, each analogue input terminal being coupled to the switch network, and the switch network is operable under the control of the interface and control logic circuit for selectively switching each analogue input signal to the monitoring output terminal.

5. A multi-channel integrated circuit as claimed in claim 4 in which a plurality of analogue input terminals are provided, each of which are coupled to the switch network for receiving respective analogue input signals.

6. A multi-channel integrated circuit as claimed in claim 4 in which the switch network is operated under the control of the interface and control logic circuit for sequentially switching the analogue output signals from the DACs and the analogue input signals from the analogue input terminals to the monitoring output terminal.

7. A multi-channel integrated circuit as claimed in claim 1 in which the interface and control logic circuit is responsive to an externally generated control signal applied through the input port for operating the switch network.

8. A multi-channel integrated circuit as claimed in claim 1 in which the switch network is provided by a multiplexer.

9. A multi-channel integrated circuit as claimed in claim 1 in which a DAC register is located in each on-chip channel for sequentially receiving digital data words from the input port under the control of the interface and control logic circuit for loading into the corresponding DAC for conversion thereof.

10. A multi-channel integrated circuit as claimed in claim 1 in which correction code registers are provided corresponding to at least some of the respective DACs for storing respective correction codes for correcting for offset errors in the corresponding DACs, and corresponding adding means are provided for adding the correction codes to digital data words to be converted by the corresponding DACs.

11. A multi-channel integrated circuit as claimed in claim 10 in which each correction code register is programmable.

12. A method for monitoring respective analogue output signals from at least some of a plurality of on-chip DACs located in respective on-chip channels of a multi-channel integrated circuit, the method comprising the steps of:
providing an on-chip monitoring output terminal in the integrated circuit for sequential monitoring of the analogue output signals from the at least some of the DACs,
providing an on-chip switch network for selectively coupling analogue outputs of the at least some of the DACs to the monitoring output terminal for selectively applying the analogue output signals from the DACs to the monitoring output terminal,
providing an on-chip interface and control logic circuit for controlling the switch network for selectively switching the analogue output signals to the monitoring output terminal, and reading the analogue output signals from the monitoring output terminal.

13. A method as claimed in claim 12 in which an on-chip input port is provided for inputting an externally generated control signal to the interface and control logic circuit for controlling the operation of the switch network.

14. A method as claimed in claim 12 in which the method further comprises providing at least one on-chip analogue input terminal for receiving a corresponding analogue input signal, coupling each analogue input terminal to the switch network, and operating the switch network under the control of the interface and control logic circuit for selectively switching the analogue input signal on each analogue input terminal to the monitoring output terminal for monitoring thereof.

15. A method as claimed in claim 14 in which a plurality of analogue input terminals are provided for receiving respective analogue input signals.

16. A method as claimed in claim 14 in which the analogue output signals from the respective DACs and the analogue input signals from the respective analogue input terminals are sequentially switched by the switch network to the monitoring output terminal.

17. A method as claimed in claim 14 in which the method further comprises the step of applying analogue input signals to the respective analogue input terminals.

18. A method as claimed in claim 12 in which a plurality of on-chip analogue output terminals are provided, one on-chip analogue output terminal being provided for each on-chip channel for outputting the analogue output signals of the respective DACs independently of each other.

19. A method as claimed in claim 12 in which the method further comprises the step of selectively applying digital data to the respective DACs through the on-chip digital input port under the control of the interface and control logic circuit for conversion thereof to analogue output signals.

20. A method as claimed in claim 12 in which the method further comprises providing correction code registers corresponding to at least some of the respective DACs for storing respective correction codes for correcting for offset errors in the corresponding DACs, and providing corresponding adding means for adding the correction codes to digital data words to be converted by the corresponding DACs.

21. A method as claimed in claim 20 in which each correction code register is programmable.

* * * * *

UNITED STATES PATENT AND TRADEMARK OFFICE
CERTIFICATE OF CORRECTION

PATENT NO. : 6,924,759 B2
DATED : August 2, 2005
INVENTOR(S) : Wynne et al.

It is certified that error appears in the above-identified patent and that said Letters Patent is hereby corrected as shown below:

Title page,
Item [75], Inventors, should read:
-- John Wynne, Limerick (IE); Donal P. Geraghty, Limerick (IE); Albert C. O'Grady, Mungret (IE) --.

Signed and Sealed this

Twenty-seventh Day of September, 2005

JON W. DUDAS
*Director of the United States Patent and Trademark Office*